(12) United States Patent
Roberts et al.

(10) Patent No.: US 6,798,267 B1
(45) Date of Patent: Sep. 28, 2004

(54) BUFFER CIRCUIT WITH PROGRAMMABLE SWITCHING THRESHOLDS

(75) Inventors: Daryl Roberts, Chandler, AZ (US); Fredrick Zlotnick, Scottsdale, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/376,395

(22) Filed: Mar. 3, 2003

(51) Int. Cl.[7] .............................................. H03L 5/00
(52) U.S. Cl. ..................................... 327/333; 327/112
(58) Field of Search ................................ 327/108, 109, 327/110, 111, 112, 318, 319, 333, 530, 534

(56) References Cited

U.S. PATENT DOCUMENTS 6,175,251 B1 * 1/2001 Horiguchi et al. ............ 326/83
6,255,867 B1 * 7/2001 Chen ........................... 327/108
6,573,781 B1 * 6/2003 Brueckner ................... 327/544

FOREIGN PATENT DOCUMENTS

EP      0405833 A2    1/1991    ....... H03K/19/0185

* cited by examiner

*Primary Examiner*—Jeffrey Zweizig

(57) ABSTRACT

A buffer circuit (100) receives a selection signal ($S_{FI}$), which selects either a first or second threshold voltage for receiving an input signal ($S_{SI}$) at a logic gate (6). A switch (1) and a level-shifter (13) are used in combination to set a voltage at a node (12). The first input signal is coupled to the switch. The logic gate is coupled to the node, and the voltage level at the node sets the threshold voltage of the logic gate of the buffer circuit.

16 Claims, 4 Drawing Sheets

BUFFER CIRCUIT WITH PROGRAMMABLE SWITCHING THRESHOLDS

BACKGROUND OF THE INVENTION

The present invention relates to semiconductor devices and, more particularly, to buffer circuits for interfacing between different logic families.

Many electronic systems use buffer circuits to interface between devices from different logic families. For example, a buffer circuit may be used to interface between a transistor-transistor logic (TTL) microprocessor unit (MPU) and a complementary metal-oxide-semiconductor (CMOS) memory device. The CMOS and TTL logic families have distinct switching thresholds in order to operate with the maximum noise immunity.

TTL logic circuits are specified to have a "zero logic level" from zero to 0.8 volt, and a "one logic level" from two volts to five volts. In order to provide a high noise immunity, a buffer circuit is specified to have a switching threshold of 1.4 volts, which is the middle of the TTL switching range.

CMOS logic circuits operate with a supply voltage up to about sixteen volts, and the logic levels are percentages of the supply voltage, with voltage levels from ground to 30% of the supply voltage being a "zero logic level", and voltage levels from 70% of the supply voltage to the supply voltage being a "one logic level". Hence, if the supply voltage is 3.3 volts, which is a common level in modern low power systems, a "zero logic level" has a range of zero to 0.55 volts, and a "one logic level" has a range of 2.75 volts to 3.3 volts. Typically, a circuit receiving CMOS logic levels has a voltage threshold of fifty percent of the supply voltage or 1.65 volts for a 3.3 volt supply voltage.

Most previous buffer circuits have a single switching threshold that is set to a level of one logic family. Thus, two different buffer circuits, each specified to receive signals from one logic family, are required in order for the MPU and memory circuits to transfer data to each other. The two buffer circuits require the manufacturing of two distinct semiconductor die, which requires the tracking of two part numbers and reduces the economies of scale and therefore increases the cost of each buffer circuit.

Hence, there is a need in the industry for a single buffer circuit that can be programmed for two distinct switching thresholds.

DETAILED DESCRIPTION OF THE DRAWINGS

In the figures, elements having the same reference numbers have similar functionality.

Figure 1:
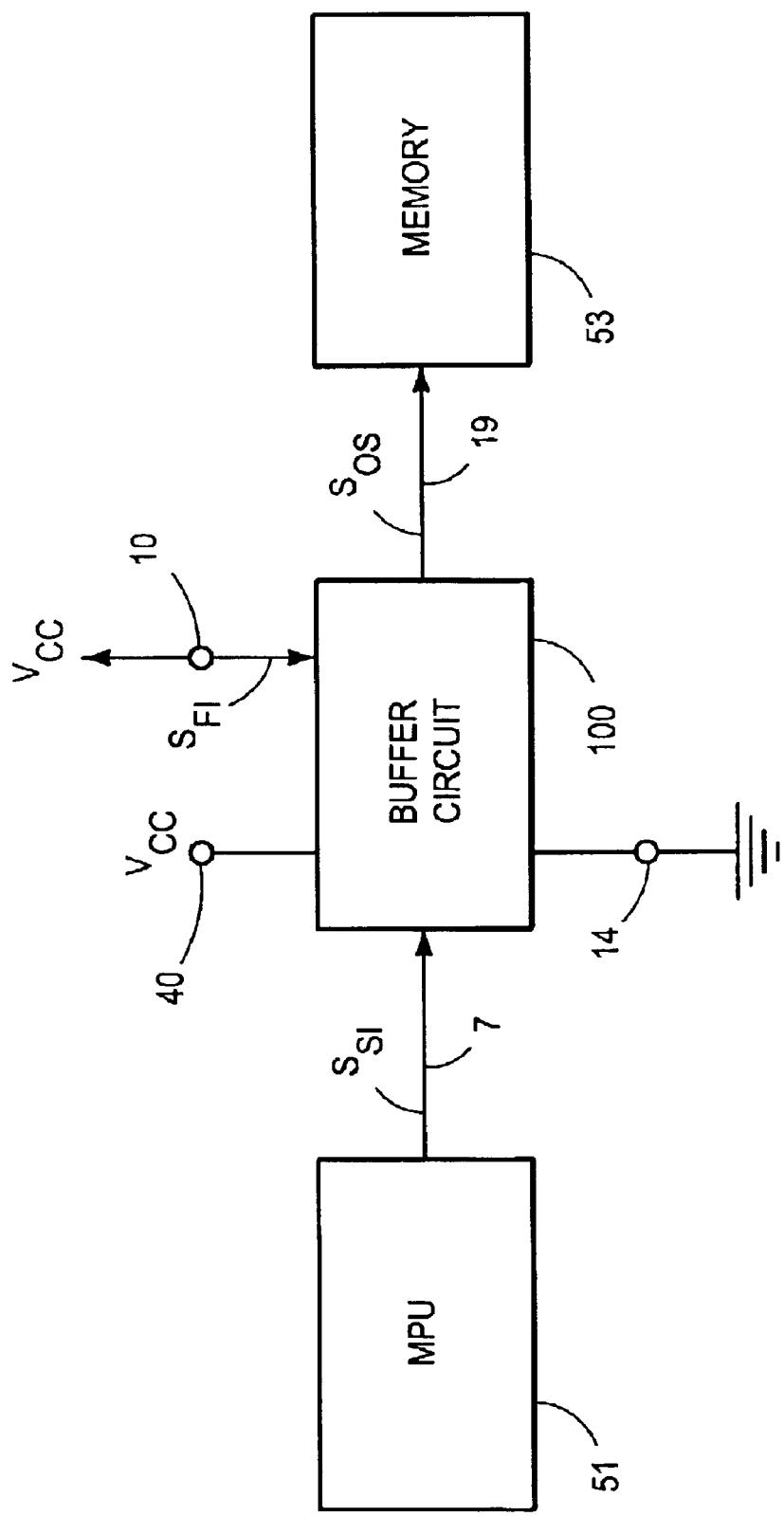
FIG. 1 is a block diagram illustrating a first electronic system including a buffer circuit.

FIG. 1 is a block diagram of a portion of a first wireless communications system including a MPU 51, a buffer circuit 100 and a memory 53.

MPU 51 is configured as a CMOS circuit operating at standard TTL logic levels. That is, MPU 51 produces data referred to as a logic signal or an input signal $S_{SI}$ to buffer circuit 100 having a logic high level greater than two volts and a logic low level less than 0.8 volts.

Buffer circuit 100 operates from a supply voltage $V_{CC}$= 3.3 volts, and has an input 7 that receives logic input signal $S_{SI}$ and translates $S_{SI}$ into CMOS logic levels to provide a logic output signal $S_{OS}$ to a memory 53, which operates with a high noise immunity when its input signals are CMOS level signals.

Buffer circuit 100 receives a supply voltage $V_{CC}$ at a supply pin or terminal 40 and has a supply pin 14 for biasing to ground potential. A select pin 10 is coupled to supply voltage $V_{CC}$ to provide a selection signal $S_{FI}$ that sets a first switching threshold, called a first value $V_{THRESH1}$, of buffer circuit 100. During a logic transition, when the level of input signal $S_{SI}$ transitions through the first value $V_{THRESH1}$, output signal $S_{OS}$ changes state.

Figure 2:
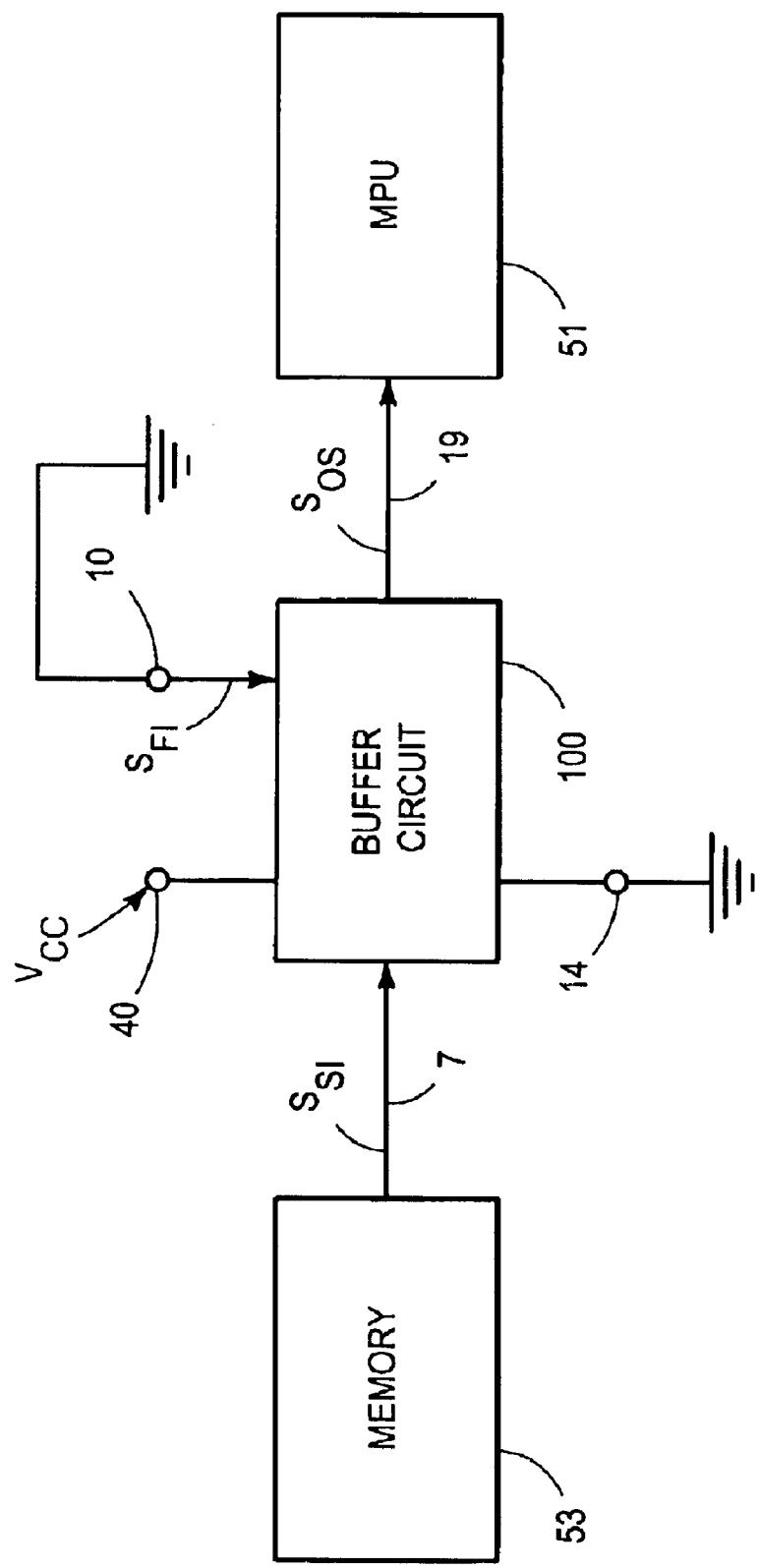
FIG. 2 is a block diagram illustrating a second electronic system showing the buffer circuit.

FIG. 2 is a block diagram of a portion of a second wireless communications system showing the buffer circuit 100 receiving input signal $S_{SI}$ from the memory 53 and providing output signal $S_{OS}$ to MPU 51. MPU 51 provides TTL level output signals and memory 53 is configured to receive CMOS level signals. In order to provide a high noise immunity, the buffer circuit 100 has the select pin 10 is coupled to ground to set the switching threshold of buffer circuit 100 to a second value $V_{THRESH2}$. When input signal $S_{SI}$, transitions through the second value $V_{THRESH2}$, the output signal $S_{OS}$ of the buffer circuit switches.

Figure 3:
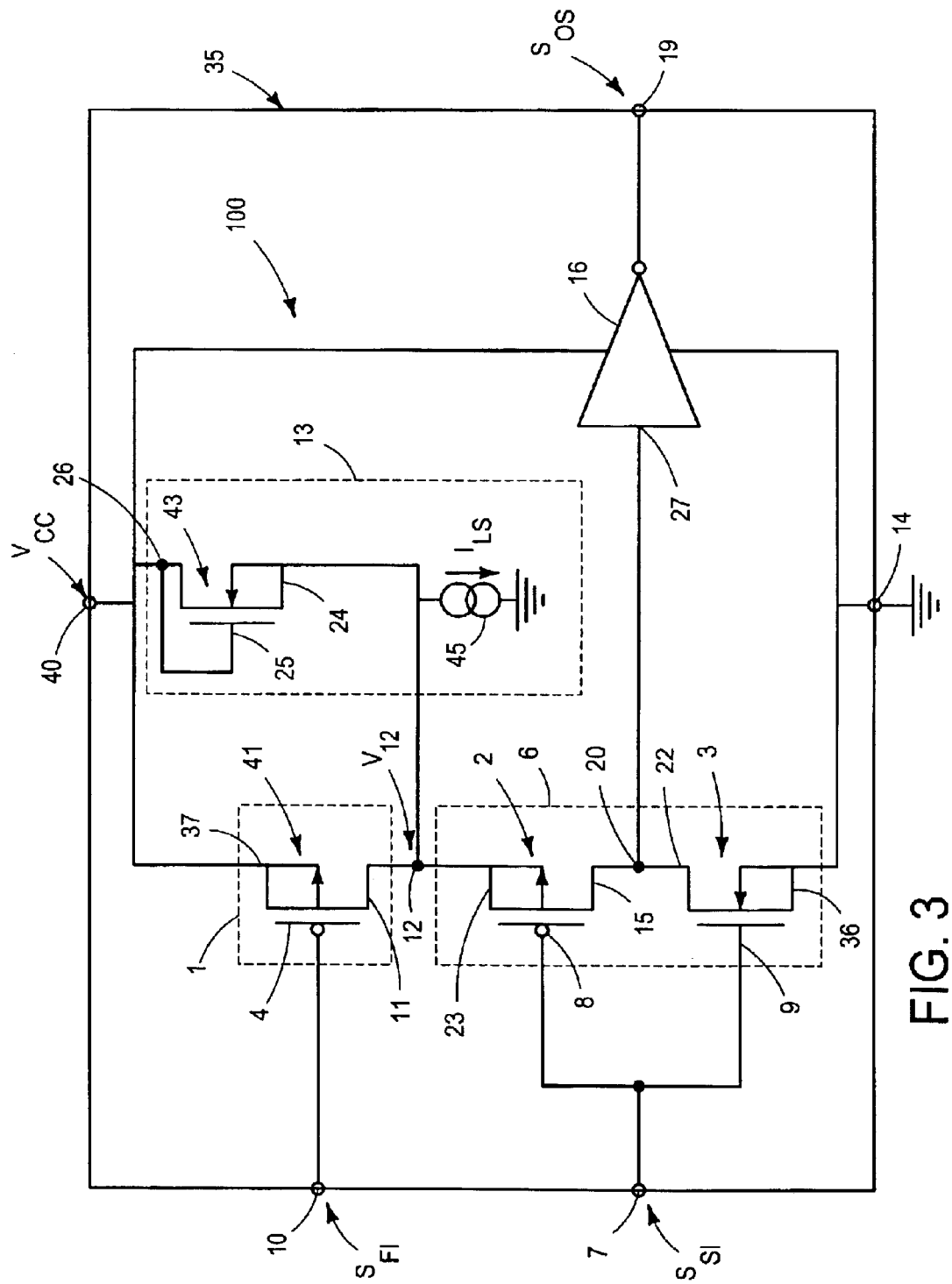
FIG. 3 is a circuit diagram of the buffer circuit.

FIG. 3 is a schematic diagram showing the buffer circuit 100 in further detail, including a logic gate 6, a switch 41 and a level shifter 43. Buffer circuit 100 is fabricated on a semiconductor die and housed in a standard five-pin package 35 for connecting to external circuitry. The pins of package 35 include select pin 10 for receiving the selection signal $S_{FI}$, input pin 7 for receiving the second input signal $S_{SI}$, output pin 19 for providing the output signal $S_{OS}$, ground pin 14 and supply pin 40 for coupling to a supply voltage $V_{CC}$. In alternate embodiment, the buffer circuit 100 does not include an inverter 16. The switching threshold at input pin 7 is selectable with selection signal $S_{FI}$ between first value $V_{THRESH1}$ and second value $V_{THRESH2}$.

Logic gate 6 is made using a p-channel metal-oxide-semiconductor (PMOS) transistor 2 and an n-channel metal-oxide-semiconductor (NMOS) transistor 3. PMOS transistor 2 and NMOS transistor 3 have their respective gate electrodes 8 and 9 coupled together at the input pin 7, and their respective drain electrodes 15 and 22 coupled together at an output node 20. The source electrode 36 of NMOS transistor 3 is coupled to ground, and the source electrode 23 of PMOS transistor 2 is coupled to a supply terminal, called a biasing node 12. The switching threshold of the logic gate 6 is established during processing of the die by forming the lengths and widths of the channels of PMOS transistor 2 and NMOS transistor 3 to achieve a switching threshold of about half the voltage at the biasing node 12. In one embodiment, the channel width of PMOS transistor 2 is about seventy micrometers, and the channel length is about 0.35 micrometers. In another embodiment, the channel width of NMOS transistor 3 is about fifteen micrometers, and the channel length is about 0.35 micrometers. The sub-micrometer channel lengths of PMOS transistor 2 and NMOS transistor 3 allow logic gate 6 to be formed in a small die area. The well regions of the PMOS transistor 2 and NMOS transistor 3 are respectively coupled to the supply voltage $V_{CC}$ and ground.

Level-shifter 43 includes an NMOS transistor 13 and a current source 45 providing a current $I_{LS}$. The level-shifter 13 level shifts supply voltage $V_{CC}$ to provide a node voltage $V_{12}$ at the biasing node 12. Current $I_{LS}$ is routed through level-shifter 13 in order to provide a stable and predictable shifted level for node voltage $V_{12}$ that is less than supply voltage $V_{CC}$ at biasing node 12. In one embodiment, current $I_{LS}$ is established with the parasitic leakage currents flowing through parasitic junction capacitance $C_{PAR}$ connected to node 12, and is enhanced by connecting a junction of level shifter 13 such as a well region of transistor 43 to ground. In an alternate embodiment, current source 45 is configured in a standard fashion to produce current $I_{LS}$ at a value of, for example, fifty nanoamperes. When the supply voltage $V_{CC}$ is applied to the drain 26 and gate 25 electrodes, inversion is promoted, and the current $I_{LS}$ flows through the source electrode 24 to charge at the biasing node 12.

NMOS transistor 43 is configured to operate with a predetermined threshold $V_t$ to level shift or offset node voltage $V_{12}$ by a predetermined amount from supply voltage $V_{CC}$. The threshold $V_t$ of transistor 43 can be adjusted to change the magnitude of the level shift. Threshold $V_t$ is established during fabrication by varying processing parameters such as threshold implant and gate oxide thickness without degrading other operating parameters or reliability of the buffer circuit 100. In one embodiment, the channel width of transistor 43 is about twenty micrometers, the channel length is about 0.35 micrometers, and threshold $V_t$ is about one volt.

Switch 1 is configured as a PMOS transistor 41, which has a source electrode 37 and a well region coupled at supply pin 40 to the supply voltage $V_{CC}$, and a drain electrode 11 coupled to a source electrode 23 of PMOS transistor 2 and the source electrode 24 of the transistor 43. The gate electrode 4 of the transistor 41 is coupled to the select pin 10 for receiving the selection signal $S_{FI}$. When selection signal $S_{FI}$ is set at the supply voltage $V_{CC}$, switch 1 turns "off", and becomes an open circuit between supply pin 40 and the biasing node 12. When selection signal $S_{FI}$ is set at ground, switch 1 turns "on", and the biasing node 12 is coupled to the supply voltage $V_{CC}$ through switch 1. In a system, select pin 10 may be driven by external logic to set the potential of biasing node 12 dynamically or may be hard wired to ground or $V_{CC}$ to set the biasing node 12 voltage to a fixed value. In one embodiment, the channel width of the switch 1 is about 70.0 micrometers and the channel length is about 0.35 micrometers, and the sub-micrometer channel length provides a small die area.

Inverter 16 comprises a standard CMOS inverting output stage with an input 27 coupled to the output node 20 of the logic gate 6 to sufficiently drive external circuitry. The inverter 16 provides the output signal $S_{OS}$ at output pin 19, and is powered from the supply voltage $V_{CC}$ and is coupled to ground.

Figure 4:
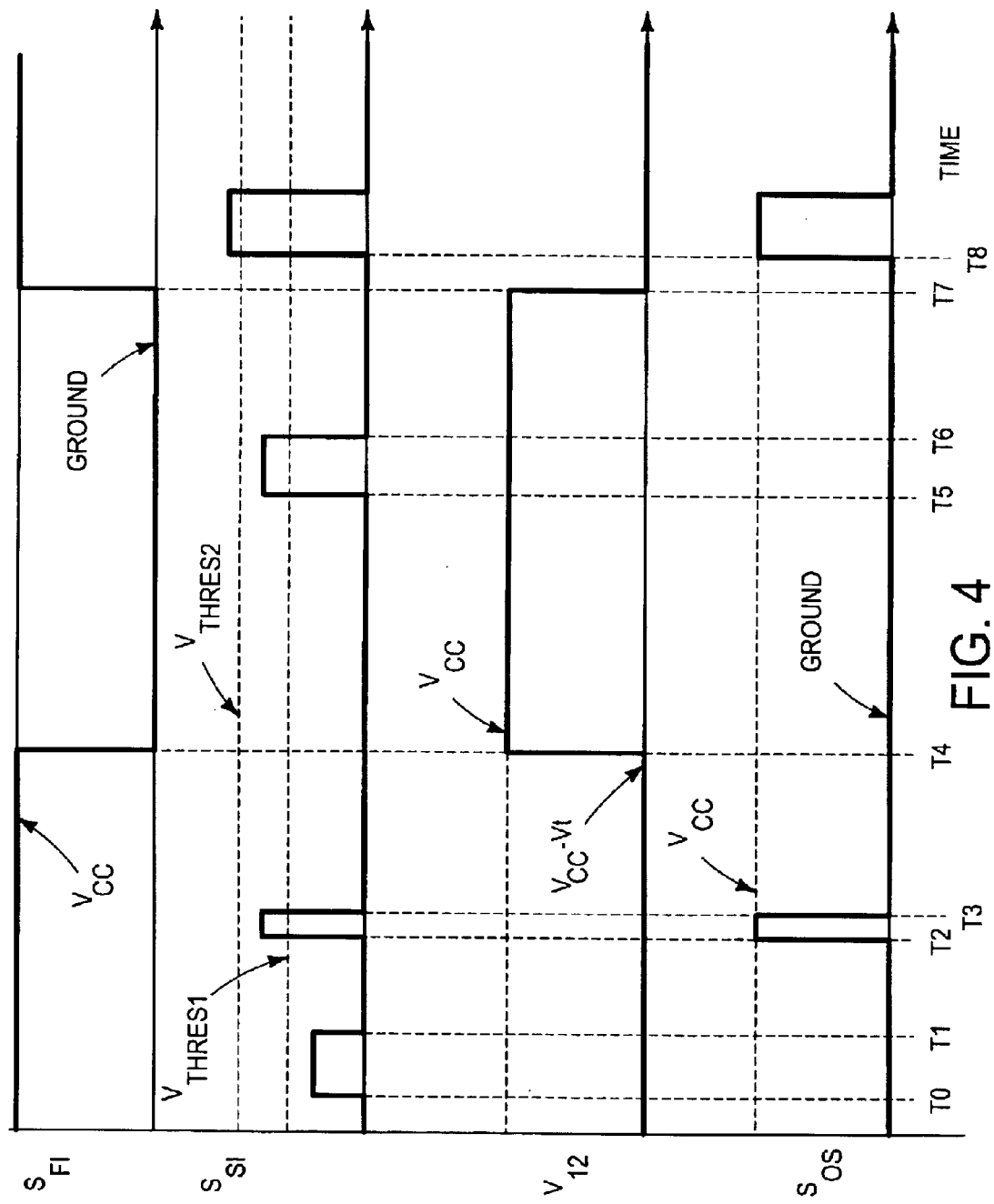
FIG. 4 is a timing diagram showing waveforms of the buffer circuit.

The operation of buffer circuit 100 can be seen by referring to the timing diagram of FIG. 4, which shows waveforms of selected nodes of buffer circuit 100. Initially, assume supply voltage $V_{CC}$=3.3 volts, selection signal $S_{FI}$ is set to a logic high level of 3.3 volts, input signal $S_{SI}$ is logic low at ground potential. Therefore, switch 1 is turned off and current $I_{LS}$ flows through level shifter 13 to offset node voltage $V_{12}$ to a level of, for example, one volt lower than $V_{CC}$, or about 2.8 volts. Hence, threshold voltage $V_{THRESH1}$ of logic gate 6 is about two volts. Output signal $S_{OS}$ is logic low.

At time T0, input signal $S_{SI}$ makes a transition from ground potential to one volt. Since one volt is less than the level of $V_{THRESH1}$, logic gate 6 does not switch, and output signal $S_{OS}$ remains low.

At time T1, input signal $S_{SI}$ makes a transition from about one volt back to ground potential.

At time T2, input signal $S_{SI}$ makes a transition from ground potential to 1.5 volts, thereby exceeding the level of $V_{THRESH1}$ and switching logic gate 6. Hence, output signal $S_{OS}$ switches with a low to high transition as shown.

At time T3, input signal $S_{IS}$ makes a transition from 1.5 volts to ground to switch output signal $S_{OS}$.

At time T4, selection signal $S_{FI}$ makes a transition from high to low, turning on switch 1 to route current $I_{LS}$ through switch 1 and pull biasing node 12 to the potential of $V_{CC}$, or 3.3 volts. The increased level of biasing node 12 increases the switching threshold of logic gate 6 to a value of $V_{THRESH2}$=1.65 volts.

At time T5, input signal $S_{SI}$, makes a transition from ground potential to 1.5 volts, which is less than the level of $V_{THRESH2}$, so logic gate 6 does not switch, and output signal $S_{OS}$ remains low.

At time T6, input signal $S_{SI}$, makes a transition from 1.5 volts to ground but output signal $S_{OS}$ does not switch.

At time T7, input signal $S_{SI}$ makes a transition from ground potential to 2.0 volts, which exceeds the level of $V_{THRESH2}$ and switches logic gate 6. Hence, output signal $S_{OS}$ switches with a low to high transition as shown.

At time T8, input signal $S_{SI}$ makes a transition from 2.0 volts to ground to switch output signal $S_{OS}$.

In summary, the present invention provides an integrated translator, or buffer circuit, having a logic gate with a node biased to a power supply voltage that sets a first value of a switching threshold. A level-shifter is coupled between the node and the power supply voltage for modifying the switching threshold to a second value. A switch is coupled across the level-shifter and operates in response to a selection signal for selecting between the first and second values of the voltage threshold. The ability to switch between logic thresholds provides the maximum noise immunity in systems incorporating circuitry from multiple logic families and allows system manufacturers to purchase, inventory and use a single buffer circuit instead of multiple buffers circuits. In addition, semiconductor manufacturers can produce a single buffer circuit at a higher volume, thereby reducing the manufacturing cost by providing greater economies of scale. Moreover, the buffer circuit has a small size and therefore easily adaptable for fitting into a standard, low cost five-pin package. Although shown in an embodiment that accommodates the TTL and CMOS logic families, the present invention easily can be configured to establish switching thresholds for other logic families by adjusting the manufacturing process to alter the threshold of a level shifting device during fabrication.

What is claimed is:

1. An integrated translator, comprising:
   a logic gate that receives a supply voltage at a node to set a first value of a switching threshold;
   a level-shifter having a first electrode for receiving the supply voltage and a second electrode coupled for level shifting the node to modify the switching threshold to a second value, wherein the level-shifter comprises a first transistor having a drain and gate commonly coupled to a supply terminal for receiving the supply voltage, and a source coupled to the node; and
   a switch coupled across the level-shifter and operating in response to a selection signal for selecting between the first and second values.

2. The integrated translator of claim 1, wherein the switch comprises a second transistor having a gate coupled to a selection input of the integrated translator for receiving a selection signal, a drain coupled to the supply terminal and a source coupled to the node.

3. The integrated translator of claim 2, wherein the level-shifter and the switch are of opposite conductivity types.

4. The integrated translator of claim 1, wherein the logic gate, further comprises:
- a first transistor having a first conduction electrode coupled to the node, a second conduction electrode coupled to an output of the integrated translator circuit for providing an output signal, and a control electrode coupled to a first input of the integrated translator; and
- a second transistor having a first conduction electrode coupled to ground potential, a second conduction electrode coupled to the output of the integrated translator circuit for providing the output signal, and a control electrode coupled to the first input of the integrated translator.

5. The integrated translator of claim 1, wherein the first value of the switching threshold is a voltage between 0.8 volts and 2.0 volts.

6. The integrated translator of claim 1, wherein the second value of the switching threshold is a voltage between 1.5 volts and 3.5 volts.

7. The integrated translator of claim 1, further comprising a package having a first pin coupled for receiving the selection signal, a second pin coupled to the first input of the integrated translator for receiving an input signal, a third pin coupled to the output of the integrated translator, a forth pin coupled for receiving the supply voltage and a fifth pin for coupling to a ground terminal.

8. A method of translating logic signals, comprising:
- biasing a node of a logic gate to a supply voltage to set a first switching threshold of the logic gate with a first transistor of a first conductivity type; and
- level shifting the node with a selection signal to set a second switching threshold of the logic gate with a second transistor of a second conductivity type.

9. The method of translating logic signals of claim 8, wherein the step of biasing includes the step of closing a switch to couple the supply voltage to the node in response to a first level of the selection signal.

10. The method of claim 9, wherein the step of level shifting includes the step of opening the switch to reduce a voltage on the node through a level shifter in response to a second level of the selection signal.

11. The method of translating logic signals of claim 8, wherein biasing the node of the logic gate includes the step of coupling a drain electrode and a gate electrode of the second transistor to the supply voltage.

12. The method of translating logic signals of claim 10, further comprising the steps of:
- increasing a current through the level-shifter as a second input signal applied to a logic gate approaches the first switching threshold;
- decreasing the reduced voltage at the supply terminal by dropping a voltage across the level-shifter until the second input signal reaches the first switching threshold of the logic gate.

13. The method of translating logic signals of claim 8, wherein the step of level shifting includes the step of toggling the selection signal between a first level and a second level, wherein the first level sets the first switching threshold of the logic gate and the second level sets the second switching threshold of the logic gate.

14. The method of translating logic signals of claim 13, wherein the step of toggling the selection signal between the first level and the second level includes the step of setting the first level to zero volts and the second level to five volts.

15. The method of translating logic signals of claim 8, wherein the step of biasing includes the step of setting the first switching threshold between 0.8 volt and 2.0 volts.

16. The method of translating logic signals of claim 8, wherein the step of biasing includes the step of setting the second switching threshold between 1.5 volt and 3.5 volts.

* * * * *